(12) United States Patent
Yamazaki et al.

(10) Patent No.: US 6,465,287 B1
(45) Date of Patent: *Oct. 15, 2002

(54) METHOD FOR FABRICATING A SEMICONDUCTOR DEVICE USING A METAL CATALYST AND HIGH TEMPERATURE CRYSTALLIZATION

(75) Inventors: Shunpei Yamazaki, Tokyo; Satoshi Teramoto, Kanagawa; Jun Koyama, Kanagawa; Yasushi Ogata, Kanagawa; Masahiko Hayakawa, Kanagawa; Mitsuaki Osame, Kanagawa, all of (JP)

(73) Assignee: Semiconductor Energy Laboratory Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/784,292

(22) Filed: Jan. 16, 1997

(30) Foreign Application Priority Data

Jan. 27, 1996 (JP) .............................................. 8-032981

(51) Int. Cl.[7] .............................................. H01L 21/84
(52) U.S. Cl. ...................... 438/162; 438/166; 438/486; 438/476
(58) Field of Search .............................. 438/476, 146, 438/150, 161, 162, 163, 166, 486

(56) References Cited

U.S. PATENT DOCUMENTS

| | | |
|---|---|---|
| 3,389,024 A | 6/1968 | Schimmer |
| 3,783,049 A | 1/1974 | Sandera |
| RE28,385 E | 4/1975 | Mayer |
| RE28,386 E | 4/1975 | Heiman et al. |

(List continued on next page.)

FOREIGN PATENT DOCUMENTS

| | | |
|---|---|---|
| EP | 178447 | 4/1986 |
| JP | 60-105216 | 10/1985 |
| JP | 61-063017 | 4/1986 |
| JP | 62-169356 | 7/1987 |

(List continued on next page.)

OTHER PUBLICATIONS

Kawazu, Japanese Journal of Applied Physics:vol. 29 No. 12 Dec. 1990 pp. 2698–2704 "Low–Temperature Crystallization of Hydrogenated Amorphous Silicon Induced by Nickel Silicide Formation".

Kawazu, Japanese journal of Applied Physics:vol. 29 No. 4 Apr. 1990 pp. 729–738 "Initial Stage of the Interfacial Reaction between Nickel and Hydrogenated Amorphous Silicon".*

(List continued on next page.)

*Primary Examiner*—Michael J. Sherry
*Assistant Examiner*—Evan Pert
(74) *Attorney, Agent, or Firm*—Nixon Peabody LLP; Jeffrey L. Costellia

(57) ABSTRACT

Concentration of metal element which promotes crystallization of silicon and which exists within a crystalline silicon film obtained by utilizing the metal element is reduced. A first heat treatment for crystallization is performed in temperature above 750° C. after introducing elemental nickel to an amorphous silicon film 103 disposed on a quartz substrate 101. Then, after obtaining the crystalline silicon film 105, it is patterned to obtain a pattern 106. Then, another heat treatment is performed within an oxidizing atmosphere at a temperature higher than that of the previous heat treatment. A thermal oxide film 107 is formed in this step. At this time, the elemental nickel is gettered to the thermal oxide film 107. Next, the thermal oxide film 107 is removed. Thereby, a crystalline silicon film 106 having low concentration of the metal element and a high crystallinity can be obtained.

17 Claims, 5 Drawing Sheets

U.S. PATENT DOCUMENTS

| | | |
|---|---|---|
| 3,890,632 A | 6/1975 | Ham et al. |
| 4,059,461 A | 11/1977 | Fan et al. |
| 4,068,020 A | 1/1978 | Reuschel |
| 4,132,571 A | 1/1979 | Cuomo et al. |
| 4,174,217 A | 11/1979 | Flatley |
| 4,226,898 A | 10/1980 | Ovshinsky |
| 4,231,809 A | 11/1980 | Schmidt |
| 4,271,422 A | 6/1981 | Ipri |
| 4,277,884 A | 7/1981 | Hsu |
| 4,300,989 A | 11/1981 | Chang |
| 4,309,224 A | 1/1982 | Shibata |
| 4,330,363 A | 5/1982 | Biegesen et al. |
| 4,331,709 A | 5/1982 | Risch et al. |
| 4,379,020 A | 4/1983 | Glaeser et al. |
| 4,409,724 A | 10/1983 | Tasch et al. |
| 4,466,073 A | 8/1984 | Boyan et al. |
| 4,472,458 A | 9/1984 | Sirinyan et al. |
| 4,481,121 A | 11/1984 | Barthel |
| 4,534,820 A | 8/1985 | Mori et al. |
| 4,544,418 A | 10/1985 | Gibbons |
| 4,546,376 A | 10/1985 | Nakata et al. |
| 4,597,160 A | 7/1986 | Ipri |
| 4,634,473 A | 1/1987 | Swartz et al. |
| 4,735,824 A | 4/1988 | Yamabe et al. |
| 4,755,481 A | 7/1988 | Faraone |
| 4,911,781 A | 3/1990 | Fox et al. |
| 4,959,247 A | 9/1990 | Moser et al. |
| 4,959,700 A | 9/1990 | Yamazaki et al. |
| 4,996,077 A | 2/1991 | Moslehi et al. |
| 4,996,523 A | 2/1991 | Bell et al. |
| 5,043,224 A | 8/1991 | Jaccodine et al. |
| 5,075,259 A | 12/1991 | Moran |
| 5,089,441 A | 2/1992 | Moslehi |
| 5,112,764 A | 5/1992 | Mitra et al. |
| 5,145,808 A | 9/1992 | Sameshima et al. |
| 5,147,826 A * | 9/1992 | Liu et al. .................... 438/233 |
| 5,173,446 A | 12/1992 | Asakawa et al. |
| 5,200,630 A | 4/1993 | Nakamura et al. |
| 5,221,423 A | 6/1993 | Sugino |
| 5,225,355 A | 7/1993 | Sugino et al. |
| 5,244,836 A | 9/1993 | Lim |
| 5,254,480 A | 10/1993 | Tran |
| 5,262,350 A | 11/1993 | Yamazaki et al. |
| 5,262,654 A | 11/1993 | Yamazaki |
| 5,275,851 A | 1/1994 | Fonash |
| 5,278,093 A | 1/1994 | Yonehara |
| 5,289,030 A | 2/1994 | Yamazaki et al. |
| 5,296,405 A | 3/1994 | Yamazaki et al. |
| 5,298,075 A | 3/1994 | Lagendijk et al. |
| 5,308,998 A | 5/1994 | Yamazaki et al. |
| 5,313,075 A | 5/1994 | Zhang et al. |
| 5,352,291 A | 10/1994 | Zhang et al. |
| 5,354,697 A | 10/1994 | Oostra et al. |
| 5,358,907 A | 10/1994 | Wong |
| 5,366,926 A | 11/1994 | Mei et al. |
| 5,387,530 A | 2/1995 | Doyle et al. |
| 5,403,772 A | 4/1995 | Zhang et al. |
| 5,424,230 A | 6/1995 | Wakai |
| 5,426,064 A | 6/1995 | Zhang et al. |
| 5,470,763 A | 11/1995 | Hamada |
| 5,480,811 A | 1/1996 | Chiang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,504,019 A | 4/1996 | Miyasaka et al. |
| 5,508,207 A | 4/1996 | Horai et al. |
| 5,508,533 A | 4/1996 | Takemura |
| 5,529,937 A * | 6/1996 | Zhang et al. ................. 437/10 |
| 5,530,266 A | 6/1996 | Yonehara et al. |
| 5,531,182 A | 7/1996 | Yonehara |
| 5,534,716 A | 7/1996 | Takemura |
| 5,543,352 A | 8/1996 | Ohtani et al. |
| 5,543,636 A | 8/1996 | Yamazaki |
| 5,550,070 A * | 8/1996 | Funai et al. |
| 5,563,426 A | 10/1996 | Zhang et al. |
| 5,569,610 A * | 10/1996 | Zhang et al. ................. 437/21 |
| 5,569,939 A | 10/1996 | Zhang et al. |
| 5,580,792 A | 12/1996 | Zhang et al. |
| 5,580,815 A | 12/1996 | Hsu et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A * | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,661,311 A | 8/1997 | Takemura et al. |
| 5,663,077 A | 9/1997 | Adachi et al. |
| 5,677,549 A | 10/1997 | Takayama et al. |
| 5,684,317 A | 11/1997 | Hwang |
| 5,684,365 A | 11/1997 | Tang et al. |
| 5,686,328 A | 11/1997 | Zhang et al. |
| 5,693,541 A * | 12/1997 | Yamazaki et al. ............. 437/21 |
| 5,693,959 A | 12/1997 | Inoue et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,717,224 A | 2/1998 | Zhang |
| 5,734,179 A | 3/1998 | Chang et al. |
| 5,744,822 A | 4/1998 | Takayama et al. ............ 257/66 |
| 5,744,824 A | 4/1998 | Kousai et al. ................ 257/74 |
| 5,756,364 A | 5/1998 | Tanaka et al. |
| 5,763,899 A | 6/1998 | Yamazaki et al. |
| 5,766,977 A | 6/1998 | Yamazaki ................... 438/151 |
| 5,773,327 A | 6/1998 | Yamazaki et al. ........... 438/154 |
| 5,773,846 A | 6/1998 | Zhang et al. ................. 257/66 |
| 5,773,847 A | 6/1998 | Hayakawa ................... 257/66 |
| 5,782,665 A | 7/1998 | Weisfield et al. |
| 5,786,796 A | 7/1998 | Takayama et al. |
| 5,795,795 A | 8/1998 | Kousai et al. ............... 437/174 |
| 5,808,321 A | 9/1998 | Mitanaga et al. ............. 257/72 |
| 5,811,327 A | 9/1998 | Funai et al. ................. 438/166 |
| 5,818,076 A | 10/1998 | Zhang et al. |
| 5,821,138 A * | 10/1998 | Yamazaki et al. |
| 5,821,560 A | 10/1998 | Arai et al. |
| 5,824,574 A | 10/1998 | Yamazaki et al. ........... 438/150 |
| 5,828,429 A | 10/1998 | Takemura |
| 5,838,508 A | 11/1998 | Sugawara |
| 5,843,225 A * | 12/1998 | Takayama et al. |
| 5,846,857 A | 12/1998 | Ju |
| 5,849,611 A | 12/1998 | Yamazaki et al. |
| 5,882,960 A | 3/1999 | Zhang et al. |

| | | | |
|---|---|---|---|
| 5,888,858 A | 3/1999 | Yamazaki et al. |
| 5,895,933 A | 4/1999 | Zhang et al. |
| 5,899,547 A | 5/1999 | Yamazaki et al. |
| 5,922,125 A | 7/1999 | Zhang |
| 5,929,464 A | * 7/1999 | Yamazaki et al. |
| 5,929,527 A | 7/1999 | Yamazaki et al. |
| 5,933,205 A | 8/1999 | Yamazaki et al. |
| 5,940,732 A | 8/1999 | Zhang |
| 5,949,107 A | 9/1999 | Zhang |
| 5,962,869 A | 10/1999 | Yamazaki et al. |
| 5,963,278 A | 10/1999 | Yamazaki et al. |
| 5,985,740 A | 11/1999 | Yamazaki et al. |
| 5,990,491 A | 11/1999 | Zhang |
| 5,990,542 A | 11/1999 | Yamazaki |
| 6,005,648 A | 12/1999 | Zhang |
| 6,011,277 A | 1/2000 | Yamazaki |
| 6,013,929 A | 1/2000 | Ohtami |
| 6,031,249 A | 2/2000 | Yamazaki et al. |
| 6,048,758 A | 4/2000 | Yamazaki et al. |
| 6,063,654 A | 5/2000 | Ohtani |
| 6,077,731 A | 6/2000 | Yamazaki et al. |
| 6,083,801 A | 7/2000 | Ohtani |
| 6,093,934 A | 7/2000 | Yamazaki et al. |
| 6,100,562 A | 8/2000 | Yamazaki et al. |
| 6,121,683 A | 9/2000 | Yamazaki et al. |
| 6,140,165 A | 10/2000 | Zhang et al. |
| 6,147,667 A | 11/2000 | Yamazaki et al. |
| 6,175,348 B1 | 1/2001 | Zhang et al. |
| 6,180,439 B1 | 1/2001 | Yamazaki et al. |
| 6,207,969 B1 | 3/2001 | Yamazaki |
| 6,278,132 B1 | 8/2001 | Yamazaki et al. |

FOREIGN PATENT DOCUMENTS

| | | |
|---|---|---|
| JP | 64-081324 | 3/1989 |
| JP | 01-187814 | 7/1989 |
| JP | 01-187874 | 7/1989 |
| JP | 01-187875 | 7/1989 |
| JP | 01-206632 | 8/1989 |
| JP | 02-140915 | 5/1990 |
| JP | 02-148687 | 6/1990 |
| JP | 02-275641 | 11/1990 |
| JP | 03-280418 | 12/1991 |
| JP | 03-280420 | 12/1991 |
| JP | 05-082442 | 4/1993 |
| JP | 05-107561 | 4/1993 |
| JP | 05-299348 | 11/1993 |
| JP | 06-232059 | 8/1994 |
| JP | 07-161634 | 6/1995 |
| JP | 07-321339 | 12/1995 |
| JP | 7-335900 | 12/1995 |
| JP | 08-129358 | 5/1996 |
| JP | 08-129359 | 5/1996 |
| JP | 08-129360 | 5/1996 |
| JP | 08-234683 | 9/1996 |
| JP | 08-241047 | 9/1996 |
| JP | 08-241048 | 9/1996 |
| JP | 08-241057 | 9/1996 |
| JP | 08-241997 | 9/1996 |

OTHER PUBLICATIONS

Hayzelden, Journal of Applied Physics: 73 (12), Jun. 15, 1993 pp. 8279–8289 "Silicide Formation and Silicide–Mediated Crystallization of Nickel Implanted Amorphous Silicon Thin Films".*

Kuo, The Electrochemical Society Proceedings: vol. 94–35 pp. 116–122 "Thin Film Transistor Technologies", Apr. 1995.*

Liu, Applied Physics Letters 55 (7) Aug. 14, 1989 pp. 660–662 "Selective area crystallization of amorphous silicon films by low–temperature rapid thermal annealing".*

Cuane, Applied Surface Science 36 (1989) pp. 597–604 "Combined CW Laser and Furnace annealing of Amorphous Si and Ge in Contact With Some Metals", Jan. 1989.*

Baker, Jr. et al., "Field Effect Transistor", pp. 849, 1968, IBM Technical Disclosure Bulletin, vol. 11, No. 7.

Green et al., "Method to Purify Semiconductor Wafers", Oct. 1973, pp. 1612–1613, IBM Tech. Discl. Bulletin, vol. 16, No. 5.

Batstone et al., "Micorscopic Processes in Crystallisation", 1994, pp. 257–268, Solid State Phenomena, vol. 37–38.

Kuper et al., "Effects of Fluorine Implantation on the Kinetics of Dry Oxidation of Silicon", 1986, pp. 985–990, Journal Applied Phys., vol. 60, No. 3.

Sze, VLSI Technology Second Edition, 1988, pp. 397–400, McGraw–Hill Publishing Company.

S. Lau et al., "Solid Phase Epitaxy in Silicide Forming System", Thin Solid Films, 47 (1977) pp. 313–322.

I.W. Boyd et al., "Oxidation of Silicon Surfaces by $CO_2$ Lasers", Applied Physics Letters, vol. 41, No. 2, Jul. 15, 1982, pp. 162–164.

S.K. Ghandi, VLSI Fabrication Principles, John Wiley & Sons, 1983, pp. 419–429.

P.Zorabedian et al., "Lateral Seeding of Silicon–on–Insu", Materials Research Society Symposia Proceedings, vol. 33, Jan. 1, 1984, pp. 81–86.

T. Hempel et al., "Needle–Like Crystallization of Ni Doped Amorphous Silicon Thin Films", Solid State Communications, vol. 85, No. 11, pp. 921–924, (1993).

A.V. Dvurechenskii et al., "Transport Phenomena in Amorphous Silicon Doped by Ion Implantation of 3d Metals", Akademikian Lavrentev Prospekt 13, 630090 Novosibirsk 90, USSR, pp. 635–640, Phys. Stat, Sol. (1986).

Wolf et al., "Silicon Processing for the VLSI Era vol. 1: Process Technology", Lattice Press 1986, pp. 215–216.

R. Kakkad et al., "Crystallized Si Films by Low–Temperature Rapid Theraml Annealing of Amorphous Silicon," J. Appl. Phys., 65(5), Mar. 1, 1989, pp. 2069–2072.

G. Liu et al., "Polycrystalline Silicon Thin Film Transistors on Corning 7059 Glass Substrates Using Short Time, Low–Temperature Processing," Appl. Phys. Lett. 62(20), May 17, 1993, pp. 2554–2556.

F. Spaepen et al., Crucial Issues in Semiconductor Materials & Processing Technologies, "Metal–Enhaned Growth in Silicon", (1992) pp. 483–499.

F. Oki et al., Jpn. J. Appl. Phys., 8 (1969) 1056 "Effect of Deposited Metals on the Crystallization Temperature . . .".

T.B. Suresh et al., Thin Solid Films, vol. 252 (1994), "Electroless Plated Ni Contacts to Hydrogenated Amorphous Silicon", pp. 78–81.

R. Kakkad et al., "Low Temperature Selective Crystallization of Amorphous Silicon", Journal of Non–Crystalline Solids, 115, 1989, pp. 66–68.

Wolf et al., "Silicon Processing for the VLSI Era", vol. 1, pp. 207–211, 1986.

Hatalis et al., "High Performance TFTs in Low Temperature Crystallized LPCVD Amorphous Silicon Films", Elec. Dev. Letters vol. EDL 8, No. 8, Aug. 1, 1987, pp. 361–364.

S. Takenaka et al., Jpn. J. Appl. Phys. vol. 29 No. 12, Dec. 12, 1990; "High Mobility Poly–Si Thin Film Transistors Using Solid Phase Crystallize a–Si Films Deposited by Plasma Enhanced Chemical Vapor Deposition", pp.

J.M. Green et al., IBM Tech. Discl. Bulletin, vol. 16, No. 5, Oct. 1973, "Method to Purify Semiconductor Wafers", pp. 1612–1613**.

A.Y. Kuznetsov et al., Inst. Phys. Conf. Ser. #134.4; proceedings of Royal Microscopical Society Conf.; Apr. 5–8, 1993; "Silicide Precipitate Formation and Solid Phase Regrowth of Ni–implanted Amorphous Silicon", pp. 191–194.

Y.N. Erokhin et al., Appl. Phys. Lett., 63, 23; Dec. 6, 1993; "Spatially Confined $NiSi_2$ Formation at 400° C on Ion Implantation Preamorphized Silicon", pp. 3173–3175.

A.Y. Kuznetsov et al., Nucl. Instruments Methods Physics Research, vol. 880/81 (1993), Enhanced Solid Phase Epitaxial Recrystallization of Amorphous Silicon Due to Nickel Silicide Preciptitation Resuling from ion implantation.

R.C. Cammarata et al., J. Mater. Res., vol. 5, No. 10, Oct. 10, 1990; "Silicide Precipitation and Silicon Crystallization in Nickel Implanted", pp. 2133–2138.

J. Stoemnos et al.; Appl. Phys. Lett., 58, 11;Mar. 18, 1991; "Crystallization of Amorphous Silicon by Reconstructive Transformation Utilizing Gold", pp. 1196–1198.

J.J. P. Bruines et al., App. Phys. Lett., vol. 50, (1987), "Between explosive crystallization and amorphous strength regrowth: In homogeneous solidification upon pulsed Laser Annealing of amorphous silicon", pp. 507–509.

Wolf et al., Silicon Processing For VLSI Era, vol. 1, pp. 550–551 (1986).

Kuper et al., "Effects of Fluorine Implantation of the Kinetics of Dry Oxidation of Silicon," Journal Applied Phys., vol. 60, No. 3, pp. 985–990 (1986)**.

Kouvatsos et al., Applied Phys. Lett., vol. 61, No. 8, pp. 937–939 . . . (1992).

Wolf et al., "Silicon Processing For The VLSI Era vol. 1: Process Technology", Lattice Press, pp. 198–207 (1986).

Hayashi et al., "Fabrication of Low–Temperature Bottom–Gate Poly–Si TFTs on Large–Area Substrate by Linear–Beam Excimer Laser Crystallization and Ion Doping Method", IEEE IEDM 1995, pp. 829–832.

S. Sze, VILSI Technology, Second Edition, . . . (1988).**.

Sakaguchi et al., IEICE Trans. Electron., vol. E80C, No. 3, Mar. 1, 1997, pp. 378–387.

R.J. Nemanich et al, "Structure and Growth of the Interface of Pd on $\alpha$–SiH", The American Physical Society—Physical Review, vol. 22, No. 12, pp. 6828–6831, Jun. 1981.

M.J. Thompson et al, "Silicide Formation in Pd–$\alpha$–Si:H Schottky Barriers", Appl. Phys. Lett., vol. 39, No. 3, pp. 274–276, Aug. 1981.

R.J. Nemanich et al., "Initial Phase Formation at the Interface of Ni, Pd, or Pt and Si", Mat. Res. Soc. Symp. Proc., vol. 25, 1984.

Specification, claims and drawings for Application No. 09/266,864 filed Mar. 12, 1999, "Semiconductor Device and Method of Forming the Same", Satoshi Teramoto.

* cited by examiner

FORMATION OF AMORPHOUS SILICON FILM AND INTRODUCTION OF NICKEL ELEMENT

HEAT TREATMENT FOR CRYSTALLIZATION

PATTERNING

HEAT TREATMENT IN OXIDIZING ATMOSPHERE

REMOVEMENT OF OXIDE FILM CONTAINING NICKEL

HEAT TREATMENT FOR CRYSTALLIZATION

PATTERNING

HEAT TREATMENT IN OXIDIZING ATMOSPHERE

REMOVEMENT OF THERMAL OXIDE FILM

METHOD FOR FABRICATING A SEMICONDUCTOR DEVICE USING A METAL CATALYST AND HIGH TEMPERATURE CRYSTALLIZATION

BACKGROUND OF THE INVENTION

1. Field of the Invention

The present invention relates to a semiconductor device typified by a thin film transistor and to a fabrication method thereof.

2. Description of Related Art

Hitherto, a thin film transistor using a silicon film, has been known as well as technology for forming the thin film transistor by using silicon film formed on a glass substrate or quartz substrate.

The glass substrate or quartz substrate is used because the thin film transistor is used for an active matrix type liquid crystal display. While a thin film transistor has been formed by using an amorphous silicon film in the past, attempts have been made to fabricate the thin film transistor by utilizing a silicon film having a crystallinity (referred to as "crystalline silicon film" hereinbelow) in order to enhance its performance.

The thin film transistor using crystalline silicon film allows operation at a high speed as compared to one using amorphous silicon film. Therefore, while peripheral driving circuits of an active matrix liquid crystal display have been composed of external IC circuits, they may be built on the glass substrate or quartz substrate similarly to the active matrix circuit.

Such structure is very advantageous in miniaturizing the whole apparatus and in simplifying the fabrication process, thus leading to the reduction of the fabrication cost.

In general, a crystalline silicon film has been obtained by forming an amorphous silicon film by means of plasma CVD or low pressure thermal CVD and then by crystallizing it by performing a heat treatment or by irradiating laser light.

However, it has been the fact that it is difficult to obtain a required crystallinity across the wide area through the heat treatment because it may cause nonuniformity in the crystallization.

Further, although it is possible to obtain the high crystallinity partly by irradiating laser light, it is difficult to obtain a good annealing effect across the wide area. In particular, the irradiation of the laser light is apt to become unstable under the condition for obtaining the good crystallinity.

Meanwhile, a technology described in Japanese Patent Laid-Open No. Hei. 6-232059 has been known. This technology provides a crystalline silicon film through a heat treatment at a lower temperature than that of the prior art by introducing a metal element (e.g. nickel) which promotes the crystallization of silicon to the amorphous silicon film.

This technology allows high crystallinity to be obtained uniformly across a wide area as compared to the prior art crystallization method by way of bulk heating or crystallization of an amorphous silicon film selectively by means of irradiation of laser light.

However, it is difficult to obtain a crystalline silicon film having high crystallinity and uniformity across a wide area which is required for an active matrix type liquid crystal display.

Further, because the metal element is contained within the film and an amount thereof to be introduced has to be controlled very carefully, there is a problem in its reproducibility and stability (electrical stability of a device obtained).

Still more, there is a problem that an elapsed change of the characteristics of a semiconductor device to be obtained is large or an OFF condition leakage value, in the case of a thin film transistor, is large, for example due to the influence of the remaining metal element. That is, although the metal element which promotes the crystallization of silicon plays the useful role in obtaining the crystalline silicon film, its existence becomes a negative factor which causes various problems after obtaining the crystalline silicon film.

SUMMARY OF THE INVENTION

It is an object of the invention disclosed in the present specification to provide a semiconductor device having excellent characteristics by using a crystalline silicon film having a high crystallinity.

It is an object of the invention disclosed in the present specification to provide a technology for reducing concentration of a metal element within a crystalline silicon film obtained by utilizing the metal element which promotes crystallization of silicon.

It is another object of the present invention to provide a technology which can enhance characteristics and reliability of the semiconductor device thus obtained.

One of the inventions disclosed in the present specification comprises steps of forming an amorphous silicon film on a substrate having an insulated surface; intentionally introducing a metal element which promotes crystallization of silicon to the amorphous silicon film; obtaining a crystalline silicon film by crystallizing the amorphous silicon film by a first heat treatment in the temperature range of 750° C. to 1100° C.; forming an active layer of the semiconductor device by patterning the crystalline silicon film; removing or reducing the metal element existing within the crystalline silicon film by performing a second heat treatment within an oxidizing atmosphere containing a halogen element; removing a thermal oxide film formed in the previous step; and forming another thermal oxide film after removing the thermal oxide film by performing another thermal oxidation, and that a temperature of the second heat treatment is higher than that of the first heat treatment.

An arrangement of another invention comprises steps of forming an amorphous silicon film on a substrate having an insulated surface; intentionally introducing a metal element which promotes crystallization of silicon, to the amorphous silicon film; obtaining a crystalline silicon film by crystallizing the amorphous silicon film by a first heat treatment in the temperature range of 750° C. to 1100° C.; forming an active layer of the semiconductor device by patterning the crystalline silicon film; performing a second heat treatment within an oxidizing atmosphere containing a halogen element to cause the metal element existing within the crystalline silicon film to be gettered to a thermal oxide film to be formed; removing the thermal oxide film formed in the previous step; and forming another thermal oxide film after removing the thermal oxide film by performing another thermal oxidation, and that a temperature of the second heat treatment is higher than that of the first heat treatment.

An arrangement of another invention comprises steps of forming an amorphous silicon film on a substrate having an insulated surface; intentionally and selectively introducing a metal element which promotes crystallization of silicon to the amorphous silicon film; growing crystal in a direction parallel to the film from a region of the amorphous silicon film into which the metal element has been intentionally and selectively introduced by a first heat treatment in the temperature range of 750° C. to 1100° C.; forming an active layer of the semiconductor device by using a region in which crystal has been grown in the direction parallel to the film by patterning; performing a second heat treatment within an oxidizing atmosphere containing a halogen element to cause the metal element existing within the active layer to be gettered to a thermal oxide film to be formed; removing the thermal oxide film formed in the previous step; and forming another thermal oxide film after removing the thermal oxide film by performing another thermal oxidation, and that a temperature of the second heat treatment is higher than that of the first heat treatment.

In the above-mentioned arrangements, it is preferable to use a quartz substrate as the substrate from the aspect of heat resistance.

Further, when a thin film transistor is to be fabricated, it is preferable to form a gate insulating film by utilizing the another thermal oxide film.

Still more, one or a plurality elements selected from Fe, Co, Ni, Ru, Rh, Pd, Os, Ir, Pt, Cu and Au may be used as the metal element which promotes the crystallization of silicon.

The concentration of oxygen contained in the amorphous silicon film, i.e. the starting film, is preferably $5\times10^{17}$ cm$^{-3}$ to $2\times10^{19}$ cm$^{-3}$. This is an important point in obtaining the effect for gettering the metal element which promotes the crystallization of silicon.

The concentration of impurity and element in the present specification is defined as the minimum value measured by SIMS (secondary ion mass spectrometry).

According to a preferred mode for carrying out the invention disclosed in the present specification, an amorphous silicon film is formed on the quartz substrate at first. Then, the amorphous silicon film is crystallized by an action of metal element typified by nickel which promotes crystallization of silicon to obtain a crystalline silicon film.

This crystallization is performed in temperature of 750° C. to 1100° C. to maximize the action and to obtain the crystalline silicon film having high crystallinity.

The metal element is contained in the crystalline silicon film in the state in which the film has been crystallized by the above-mentioned heat treatment.

Next, the active layer of the semiconductor device, e.g. an active layer of a thin film transistor, is formed by patterning.

Another heat treatment is performed within an oxidizing atmosphere containing a halogen element (e.g. HCl) to form a thermal oxide film on the surface of the pattern of the active layer made of the crystalline silicon film.

At this time, the gettering effect may be not fully obtained if the temperature of the heat treatment is too high because the film forming speed of the thermal oxide film might become too fast. In such a case, the film forming speed of the thermal oxide film may be controlled by diluting oxygen by inert gas.

Then, the metal element is gettered into the thermal oxide film to be formed by the action of the halogen element and the concentration of the metal element within the crystalline silicon film is reduced.

The heat treatment for gettering the nickel element is preferable to perform at a temperature higher than that of the heat treatment for the crystallization.

As a result of the heat treatment for gettering, a thermal oxide film containing the nickel element in high concentration is formed. Then, the crystalline silicon film having the high crystallinity and having low concentration of the metal element may be obtained by removing this thermal oxide film.

DETAILED DESCRIPTION OF THE INVENTION

First Embodiment

Figure 1A:
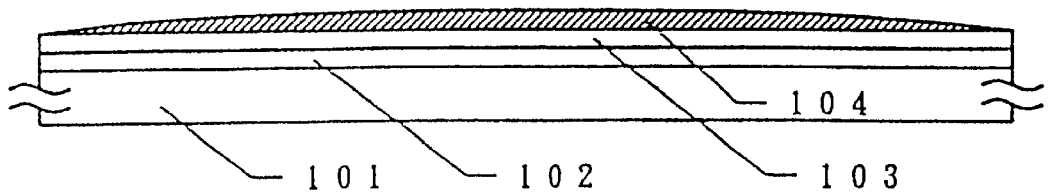
FIGS. 1A through 1E illustrate steps for obtaining a crystalline silicon film.

An arrangement for obtaining a crystalline silicon film on a quartz substrate by utilizing nickel will be explained in the present embodiment. At first, an amorphous silicon film formed on the quartz substrate is transformed into the crystalline silicon film having a high crystallinity by an action of elemental nickel in the present embodiment.

Then, a thermal oxide film is formed by performing a heat treatment in an oxidizing atmosphere into which HCl is added. At this time, the elemental nickel remaining in the crystalline silicon film thus obtained is gettered by an action of chlorine (Cl).

Then, after the gettering step, the thermal oxide film containing the elemental nickel in high concentration is removed. Thereby, the crystalline silicon film having elemental nickel in low concentration while having the high crystalinity is obtained on the glass substrate.

A fabrication process of the present embodiment will be explained by using FIG. 1 below. At first, a silicon oxide nitride film 102 is formed as an underlying film in a thickness of 5000 angstrom on the quartz substrate 101. Preferably, the underlying film is formed to be about 5000 angstrom or more in order to have a function of relaxing the difference of coefficient of thermal expansions of the quartz substrate 101 and a silicon film to be formed later.

The silicon oxide nitride film is formed by using plasma CVD using sillane, $N_2O$ gas and oxygen as original gases. Or, it may be formed through plasma CVD using TEOS gas and $N_2O$ gas.

It is effective to include a small amount of halogen element typified by chlorine in the underlying film 102. Thereby, the metal element which promotes crystallization of silicon and which exists within the semiconductor layer may be gettered by the halogen element in the later step.

It is also effective to perform a hydrogen plasma treatment after forming the underlying film. It is also effective to perform a plasma treatment in an atmosphere in which oxygen and hydrogen are mixed. These treatments are effective in removing carbon component which is adsorbed on the surface of the underlying film and in enhancing the characteristic of interface with a semiconductor film formed later.

Next, an amorphous silicon film 103, which turns out to be a crystalline silicon film later, is formed in a thickness of 500 angstrom by the low pressure thermal CVD. The reason why the low pressure thermal CVD is used is the quality of the crystalline silicon film obtained later is better, i.e. the film quality is denser in concrete. Besides the low pressure thermal CVD, the plasma CVD may be used.

The amorphous silicon film fabricated here is desirable to have $5 \times 10^{17}$ cm$^{-3}$ to $2 \times 10^{19}$ cm$^{-3}$ of concentration of oxygen within the film. It is because oxygen plays an important role in the later step of gettering the metal element which promotes crystallization of silicon. However, care must be taken here because the crystallization of the amorphous silicon film is hampered if the oxygen concentration is higher than the above-mentioned range of concentration. Also, the concentration of other impurities such as nitrogen and carbon is preferred to be as low as possible. In concrete, the concentration must be below $2 \times 10^{19}$ cm$^{-3}$.

The thickness of the amorphous silicon film may be selectively set from 1000 angstrom to 5000 angstrom.

Next, elemental nickel is introduced to the amorphous silicon film 103 to crystallize it. Here, the nickel element is introduced by applying nickel acetate solution containing 10 ppm (reduced to weight) of nickel on the surface of the amorphous silicon film 103. Besides the method of using the above-mentioned solution, sputtering, CVD, plasma treatment or adsorption may be used as the method for introducing the elemental nickel.

The above method of using the solution is useful in that it is simple and that it is easy to adjust the concentration of the metal element. By the nickel acetate solution is applied as described above, a water film 104 is formed as shown in FIG. 1A. In this state, extra solution is blown out by using a spin coater not shown. Thus, the elemental nickel is held in contact on the surface of the amorphous silicon film 103.

It is preferable to use nickel sulfate solution for example, instead of using the nickel acetate, if the remaining impurities in the later heating process is taken into consideration. It is because the nickel acetate contains carbon and it might be carbonized in the later heating process, thus remaining within the film.

An amount of the nickel element to be introduced may be controlled by adjusting the concentration of elemental nickel within the solution.

Figure 1B:
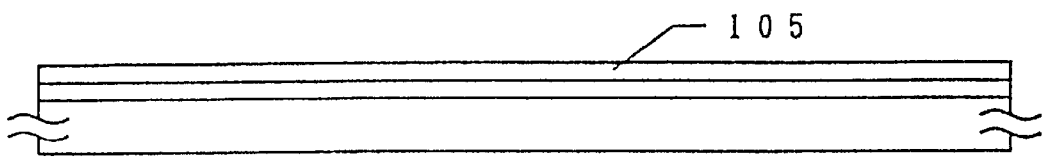

Next, a heat treatment is performed in the temperature range from 750° C. to 1100° C. in the state shown in FIG. 1B to crystallize the amorphous silicon film 103 and to obtain a crystalline silicon film 105 in this case. The heat treatment of four hours at 900° C. is performed in a nitrogen atmosphere to which 2% of hydrogen is mixed (reducing atmosphere).

The reason why the reducing atmosphere is adopted in the crystallization step in a way of the heat treatment is to prevent oxides from being generated in the step of the heat treatment and more concretely, in order to suppress NiO$_x$ from being generated on the surface of the film or within the film by reacting nickel and oxygen. Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being generated to the utmost in the crystallization step in a way of heating. The concentration of oxygen within the atmosphere for performing the heat treatment for the crystallization has to be in an order of ppm, or preferably, less than 1 ppm.

Inert gases such as argon, besides nitrogen, or their mixed gas may be used as the gas which occupies the most of the atmosphere for performing the heat treatment for the crystallization.

Figure 1C:
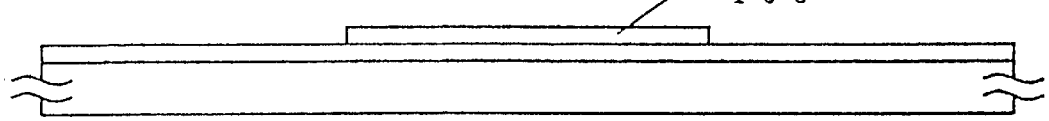

After obtaining the crystalline silicon film 105, it is patterned to form an island region 106 which is used as an active layer of a thin film transistor later (FIG. 1C).

Figure 1D:
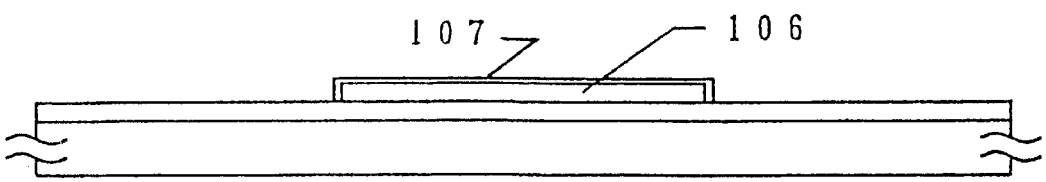

Next, another heat treatment is performed again in the step shown in FIG. 1D to form a thermal oxide film for gettering elemental nickel. In this embodiment, this heat treatment is performed within an atmosphere containing 3% of HCl for one hour and a half (FIG. 1D).

This step is carried out to remove the elemental nickel (or another metal element which promotes crystallization of silicon) which has been introduced intentionally for the crystallization in the initial stage from the crystalline silicon film 106 formed into the island pattern. This heat treatment is performed at a temperature higher than that of the heat treatment performed for the crystallization described above. It is an important condition for effectively performing the gettering of elemental nickel.

Because the thermal oxide film 107 is formed, the thickness of the crystalline silicon film 106 formed into the island pattern is reduced by about 100 angstrom.

In the gettering, oxygen existing within the crystalline silicon film plays an important role. That is, the gettering of elemental nickel proceeds in a manner that chlorine element acts on nickel oxide generated form coupling oxygen and nickel. If the concentration of oxygen is too much, it hampers the crystallization of the amorphous silicon film 103 in the crystallization step shown in FIG. 1B as described above. However, the existence of oxygen plays an important role in the process of gettering nickel as described above. Accordingly, it is important to control the concentration of oxygen existing within the amorphous silicon film, as a starting film.

Also in the above-mentioned step, because the elemental nickel is gettered to the oxide film the concentration of elemental nickel within the oxide film becomes high as compared to other regions naturally.

Further, it is observed that the concentration of elemental nickel is apt to be high near the interface between the silicon film 106 and the thermal oxide film 107. It is considered to happen because the region where the gettering takes place is on the side of the oxide film near the interface between the silicon film and the oxide film. It is also considered that the reason why the gettering proceeds near the interface is because stress and defects exist near the interface.

Here, the case of using chlorine (Cl) as the halogen element and of using HCl has been shown. Besides HCl, one or a plurality of mixed gas selected from HF, HBr, Cl$_2$, F$_2$, Br$_2$ may be used. Besides them, halogen hydroxide may be used in general. It is preferable to set the content (volume content) of those gases within the atmosphere to 0.25 to 5% if it is HF, 1 to 15% if it is HBr, 0.25 to 5% if it is Cl$_2$, 0.125 to 2.5% if it is F$_2$ and 0.5 to 10% if it is Br$_2$.

If the concentration is below the above-mentioned range, no significant effect is obtained. Further, if the concentration exceeds the upper limit of the above-mentioned range, the surface of the crystalline silicon film is roughened.

Figure 1E:
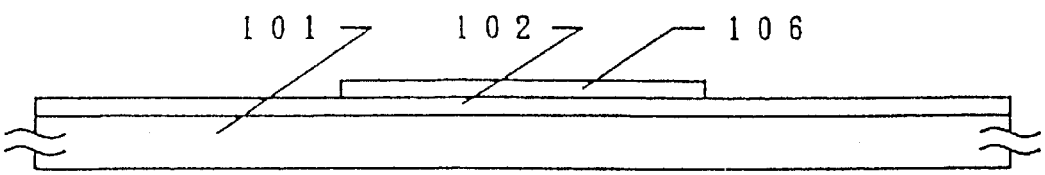

After forming the thermal oxide film by the heat treatment in the oxidizing atmosphere containing the halogen element, the thermal oxide film 107 containing nickel in high concentration is removed. The thermal oxide film 107 may be removed by means of wet etching or dry etching using buffer hydrofluoric acid (or other hydrofluorite etchant). Thus, the island pattern 106 made of the crystalline silicon film in which the concentration of nickel has been reduced is obtained as shown in FIG. 1E.

Because elemental nickel is contained near the surface of the obtained crystalline silicon film 106 relatively in high concentration, it is effective to advance the above-mentioned etching so as to over-etch, more or less, the surface of the crystalline silicon film 106. It is also effective to irradiate laser light again after removing the thermal oxide film 107 to promote the crystallinity of the crystalline silicon film 106 thus obtained. That is, it is effective to irradiate laser light again after gettering elemental nickel.

In the present embodiment, KrF excimer laser (wavelength: 248 nm) is used. However, XeCl excimer laser (wavelength: 308 nm) and the like may be used.

Besides laser light, it is possible to arrange so as to irradiate ultraviolet rays or infrared rays for example.

It is also effective to form another thermal oxide film not shown by performing a heat treatment again after obtaining the state shown in FIG. 1E. This thermal oxide film functions as part of or as a gate insulating film when a thin film transistor is constructed later. Because the thermal oxide film enhances the interfacial characteristics with an active layer made of the crystalline silicon film, so that it is suitable as a component for composing the gate insulating film.

Second Embodiment

The present embodiment relates to a case when Cu is used as the metal element which promotes the crystallization of silicon in the arrangement shown in the first embodiment. In this case, cupric acetate [$Cu(CH_3COO)_2$] or cupricchloride ($CuCl_2 \cdot 2H_2O$) may be used as the solution for introducing Cu.

Third Embodiment

The present embodiment relates to a case of crystallizing in the form different from that in the first embodiment. That is, the present embodiment relates to a method of crystallizing the silicon film in a growth direction parallel to the substrate, i.e. a method called lateral growth, by utilizing the metal element which promotes crystallization of silicon.

FIG. 2 shows the fabrication process according to the present embodiment. At first, a silicon oxide nitride film is formed as an underlying film 202 in a thickness of 3000 angstrom on a quartz substrate 201.

Next, an amorphous silicon film 203 which is the starting film of a crystalline silicon film is formed in a thickness of 2000 angstrom by low pressure thermal CVD. It is noted that plasma CVD may be used instead of the low pressure thermal CVD.

Next, a silicon oxide film not shown is formed in a thickness of 1500 angstrom and is patterned to form a mask 204. An opening of the mask is formed in a region 205. The amorphous silicon film 203 is exposed at the region where the opening 205 is created.

The opening 205 has a thin and long rectangular shape in the longitudinal direction from the depth to the front side of the figure. Preferably, the width of the opening 203 is 20 $\mu$m or more. The length thereof in the longitudinal direction may be determined as necessary.

Then, the nickel acetate aqueous solution containing 10 ppm of elemental nickel in terms of weight is applied in the same manner with the first embodiment and the extra solution is removed by performing spin drying by using a spinner not shown.

Figure 2A:
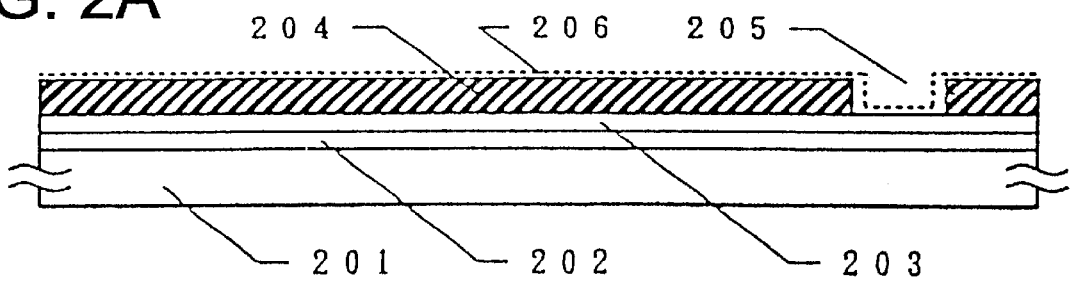
FIGS. 2A through 2E illustrate steps for obtaining a crystalline silicon film.

Thus, the solution is held in contact on the exposed surface of the amorphous silicon film 203 as indicated by a dot line 206 in FIG. 2A.

Next, a heat treatment is performed at 800° C. for four hours in a nitrogen atmosphere in which oxygen is minimized.

Figure 2B:
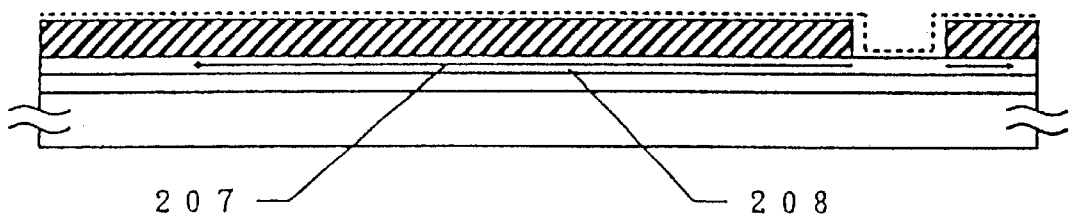

Then, crystal grows in the direction parallel to the substrate 201 as indicated by the reference numeral 207 in FIG. 2B. This crystal growth advances from the region of the opening 205 to which elemental nickel has been introduced to the surrounding part. This crystal growth in the direction parallel to the substrate will be referred to as lateral growth.

It is possible to form this lateral growth across more than 100 $\mu$m under the conditions shown in the present embodiment. Then, a crystalline silicon film 208 having the region in which the crystal has thus grown laterally is obtained. It is noted that crystal growth in the vertical direction called vertical growth advances from the surface of the silicon film to the underlying interface in the region where the opening 205 is formed.

Then, the mask 204 made of the silicon oxide film for selectively introducing elemental nickel is removed.

Figure 2C:
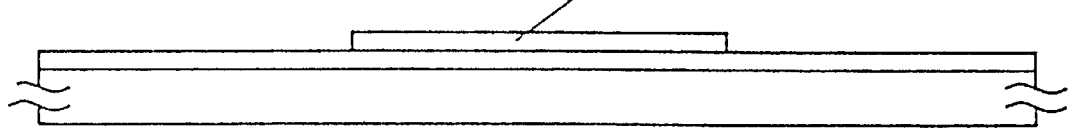

It is patterned further to form an island pattern 209 made of the crystalline silicon film in which the crystal has grown in the direction parallel to the film (lateral growth) (FIG. 2C).

After obtaining the state shown in FIG. 2C, a heat treatment is performed at 950° C. for one hour and a half within a nitrogen atmosphere containing 10% of oxygen and 3% of HCl to oxygen.

Figure 2D:

In this step, an oxide film 210 containing (gettered) elemental nickel in high concentration is formed. In the same time, the concentration of elemental nickel within the silicon film 210 may be reduced relatively (FIG. 2D).

Here, the thermal oxide film 210 is formed in a thickness of 200 angstrom. The thermal oxide film contains the elemental nickel gettered as the formation of the film in high concentration. Further, because the thermal oxide film 210 is formed, the thickness of the crystalline silicon film 209 is reduced to about 500 angstrom.

Figure 2E:
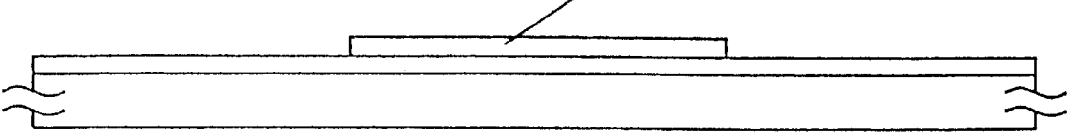

Next, the thermal oxide film 210 containing elemental nickel in high concentration is removed (FIG. 2E). In this state, in the active layer (crystalline silicon film formed into the island shape) 209 of this state, the elemental nickel has a distribution of concentration such that it exists in high concentration toward the surface of the crystalline silicon film. This state is caused by the fact that the elemental nickel has been gettered into the thermal oxide film 210 when the thermal oxide film 210 is formed. Accordingly, it is useful to further etch the surface of the crystalline silicon film to remove the region in which the elemental nickel exists in high concentration after removing the thermal oxide film 209.

The concentration of elemental nickel which remains within the pattern 209 made of the lateral growth region may be reduced further as compared to the case shown in the first embodiment. This is caused by the fact that the concentration of the metal element contained within the lateral growth region is low originally. In concrete, the concentration of elemental nickel within the pattern 209 made of the lateral growth region may be readily reduced to the order of $10^{17}$ $cm^{-3}$ or less.

When a thin film transistor is formed by utilizing the lateral growth region, a semiconductor device having a higher mobility may be obtained as compared to the case when the vertical growth region as shown in the first embodiment (crystal grows vertically on the whole surface in the case of the first embodiment) is utilized.

After obtaining the state shown in FIG. 2E, a thermal oxide film not shown is formed further on the surface of the active layer 209. This thermal oxide film may be formed into a thickness of 500 angstrom by performing a heat treatment within an oxygen atmosphere at 950° C. for 30 minutes.

Needless to say, the thickness of the thermal oxide film may be set at a predetermined value by controlling the heating time, heating temperature and the concentration of oxygen within the atmosphere.

If a thin film transistor is to be fabricated later, a silicon oxide film is formed so as to cover the thermal oxide film by plasma CVD or the like in order to form a gate insulating film together with the thermal oxide film. Or, the thermal oxide film may be formed into a predetermined thickness to use as the gate insulating film as it is.

Fourth Embodiment

The present embodiment relates to a case of fabricating a thin film transistor disposed in a pixel region of an active matrix type liquid crystal display or an active matrix type EL display by utilizing the invention disclosed in the present specification.

FIG. 3 shows the fabrication process according to the present embodiment. At first, an island shape semiconductor layer (layer made of the crystalline silicon film) patterned into the shape of an active layer is formed on the glass substrate through the process shown in the first or the third embodiment. Then, a thermal oxide film of 200 angstrom is formed on the surface thereof by thermal oxidation.

Figure 3A:
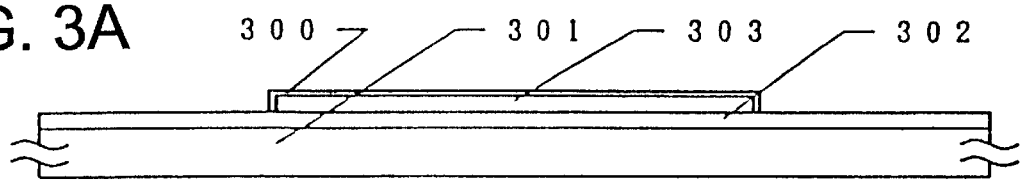
FIGS. 3A through 3E illustrate steps for fabricating a thin film transistor.

In FIG. 3A, the reference numeral 301 denotes a glass substrate, 302 an underlying film, and 303 an active layer formed of the crystalline silicon film.

Before forming the thermal oxide film 303, a plasma treatment is performed within a reduced pressure atmosphere in which oxygen and hydrogen are mixed. The plasma is generated by high-frequency discharge.

Organic substances existing on the exposed surface of the active layer 303 may be removed by the above-mentioned plasma treatment. To be exact, the organic substances adsorbing on the surface of the active layer are oxidized by oxygen plasma and then the oxidized organic substances are reduced and vaporized further by hydrogen plasma. Thus the organic substances existing on the surface of the exposed active layer 303 are removed.

The removal of the organic substances is very effective in suppressing fixed charge from existing on the surface of the active layer 303. Because the fixed charge caused by the existence of organic substances hampers the operation of the device and renders the characteristics thereof instable, it is very useful to reduce it.

After obtaining the state shown in FIG. 3A, a silicon oxide nitride film 304 which composes the gate insulating film is formed in a thickness of 1000 angstrom. The film may be formed through plasma CVD using mixed gas of silane and $N_2O$ or plasma CVD using mixed gas of TEOS and $N_2O$. The silicon oxide nitride film 304 functions as the gate insulating film together with the thermal oxide film 300.

It is also effective to contain halogen element within the silicon oxide nitride film. That is, by fixing the elemental nickel due to the action of the halogen element, it is possible to prevent the function of the gate insulating film from being reduced by the influence of the elemental nickel (or another metal element which promotes crystallization of silicon) existing within the active layer.

It is significant useful that metal element hardly infiltrates to the gate insulating film due to dense film quality of the silicon oxide nitride film. If metal element infiltrates into the gate insulating film, its function as an insulating film is reduced, thus causing instability and dispersion of characteristics of the thin film transistor.

It is noted that a silicon oxide film which is normally used may be also used for the gate insulating film.

After forming the silicon oxide nitride film 304 which functions as the gate insulating film, an aluminum film not shown which functions as a gate electrode later is formed by sputtering. 0.2 weight % of scandium is included within the aluminum film. Scandium is included in the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 3B:
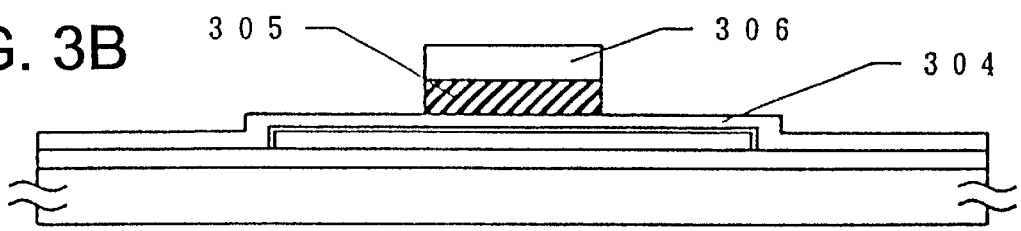
Figure 3C:
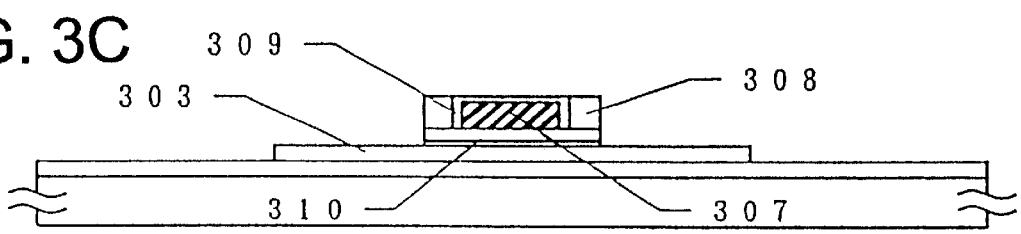

Next, the resist mask 306 is formed and the aluminum film is patterned so as to have a pattern 305. The state shown in FIG. 3B is thus obtained.

Here, another anodization is performed. In this case, 3% of oxalate aqueous solution is used as electrolyte. A porous anodic oxide film 308 is formed by anodizing within this electrolyte by setting the aluminum pattern 305 as the anode. In this step, the anodic oxide film 308 is formed selectively on the sides of the aluminum pattern because the resist mask 306 having the high adhesiveness exists thereabove. The anodic oxide film may be grown up to several $\mu$m thick. The thickness is 6000 angstrom here. It is noted that the range of the growth may be controlled by adjusting an anodizing time.

Next, the resist mask 306 is removed. Then, a dense anodic oxide film is formed again. That is, the anodization is performed again by using the ethylene glycol solution containing 3% of tartaric acid as electrolyte. Then, an anodic oxide film 309 having a dense film quality is formed because the electrolyte infiltrates into the porous anodic oxide film 308. This dense anodic oxide film 309 is 1000 angstrom thick. The thickness is controlled by adjusting applied voltage.

Here, the exposed silicon oxide nitride film 304 and the thermal oxide film 300 are etched through dry etching. Then, the porous anodic oxide film 308 is removed by using mixed acid in which acetic acid, nitric acid and phosphoric acid are mixed. Thus, the state shown in FIG. 3D is obtained.

Figure 3D:
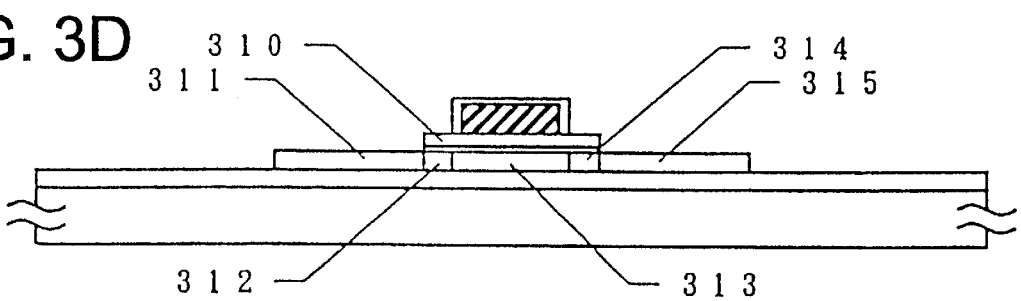

After obtaining the state shown in FIG. 3D, impurity ions are implanted. Here, P (phosphorus) ions are implanted by plasma doping in order to fabricate an N-channel type thin film transistor.

In this step, heavily doped regions 311 and 315 and lightly doped regions 312 and 314 are formed because part of the remaining silicon oxide film 310 functions as a semi-permeable mask, and the implanted ions are blocked there.

Then, laser light or intense light is irradiated to activate the regions into which the impurity ions have been implanted. Thus, a source region 311, a channel forming region 313, a drain region 315 and low concentrate impurity regions 312 and 314 are formed in a manner of self-alignment.

One designated by the reference numeral 314 here is the region called the LDD (lightly doped drain) (FIG. 3D).

It is noted that when the dense anodic oxide film 309 is formed as thick as 2000 angstrom or more, an offset gate region may be formed on the outside of the channel forming region 313 by its thickness. Although the offset gate region is formed also in the present embodiment, it is not shown in the figures because its size is small, and its contribution due to the existence thereof is small and the figures might otherwise become complicated.

Next, a silicon oxide film or a silicon nitride film or their laminated film is formed as an interlayer insulating film 316. The interlayer insulating film may be constructed by forming a layer made of a resin material on the silicon oxide film or the silicon nitride film.

Figure 3E:
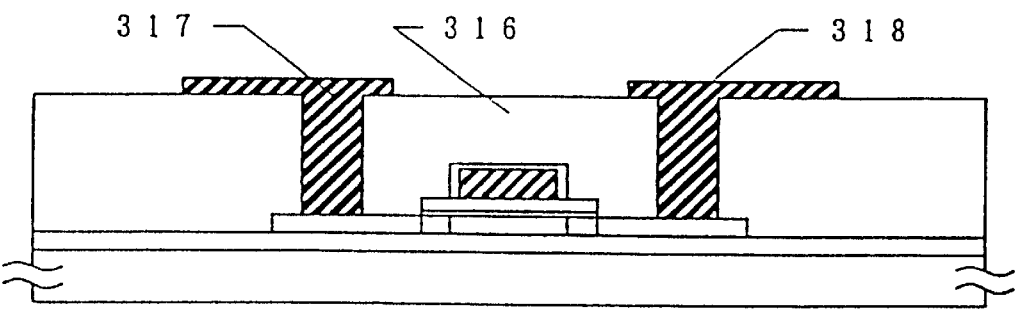

Then, contact holes are formed to provide a source electrode 317 and a drain electrode 318. Thus, the thin film transistor shown in FIG. 3E is completed.

Fifth Embodiment

The present embodiment relates to a case of fabricating a thin film transistor through a process different from that shown in FIG. 3.

FIG. 4 shows the fabrication process according to the present embodiment. At first, the crystalline silicon film is formed on the glass substrate through the process shown in the first or third embodiment. It is then patterned and a plasma treatment is performed within a low pressure atmosphere in which oxygen and hydrogen are mixed.

Figure 4A:
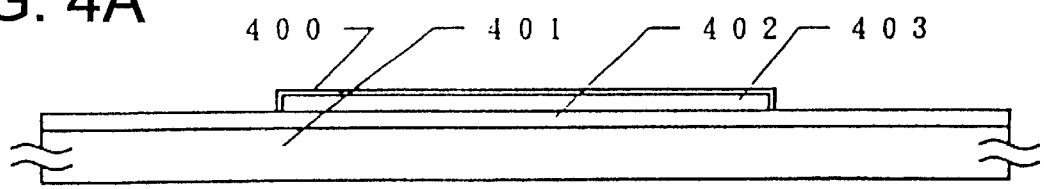
FIGS. 4A through 4E illustrate steps for fabricating a thin film transistor.
Figure 4B:
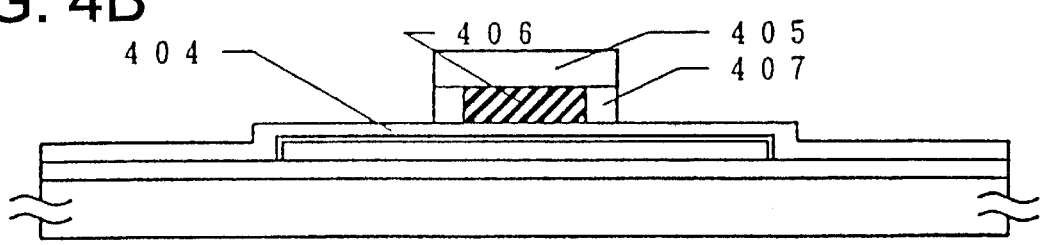
Figure 4C:
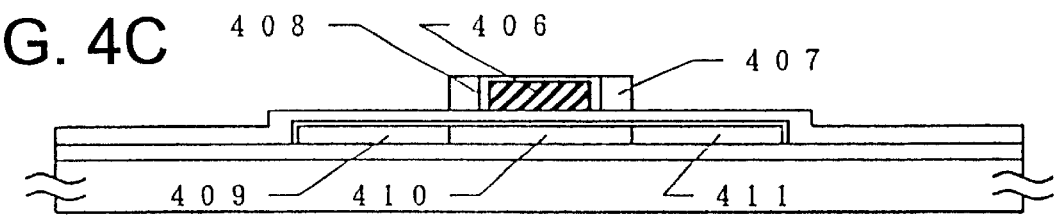

Then, a thermal oxide film 400 is formed into a thickness of 200 angstrom, thus obtaining the state shown in FIG. 4A. The thermal oxide film 400 may be formed by performing a heat treatment of 30 minutes in an oxygen atmosphere at 950° C.

In the state shown in FIG. 4A, the reference numeral 401 denotes a glass substrate, 402 an underlying film, 403 an active layer formed of the crystalline silicon film and 400 a thermal oxide film formed again after removing the thermal oxide film for gettering.

After obtaining the state shown in FIG. 4A, a silicon oxide nitride film 404 which composes a gate insulating film is formed to a thickness of 1000 angstrom. The film may be formed through plasma CVD using mixed gas of oxygen, silane and $N_2O$ or plasma CVD using mixed gas of TEOS and $N_2O$.

The silicon oxide nitride film 404 composes the gate insulating film together with the thermal oxide film 400. It is noted that a silicon oxide film may be used besides the silicon oxide nitride film.

After forming the silicon oxide nitride film 404 which functions as the gate insulating film, an aluminum film not shown which functions as a gate electrode later is formed by sputtering, scandium is included at 0.2 weight % of aluminum within the aluminum film.

After forming the aluminum film, a dense anodic oxide film not shown is formed. The anodic oxide film is formed by using ethylene glycol solution containing 3% of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Next, the resist mask 405 is formed and the aluminum film is patterned so as to have a pattern 406.

Here, another anodization is performed. In this case, 3% of oxalate aqueous solution is used as electrolyte. A porous anodic oxide film 407 is formed by anodizing within this electrolyte by setting the aluminum pattern 406 as the anode.

In this step, the anodic oxide film 407 is formed selectively on the sides of the aluminum pattern because the resist mask 405 having the high adhesiveness exists over the aluminum pattern. The anodic oxide film may be grown up to several μm thick. The thickness is 6000 angstrom here. It is noted that the range of the growth may be controlled by adjusting an anodizing time.

Then, the resist mask 405 is removed and another dense anodic oxide film is formed. That is, the anodization is performed again by using the ethylene glycol solution containing 3% of tartaric acid as electrolyte. Then, an anodic oxide film 408 having a dense film quality is formed because the electrolyte infiltrates into the porous anodic oxide film 407.

Here, the initial implantion of impurity ions is performed. A source region 409 and a drain region 411 are formed by implanting the impurity ions. No impurity ion is implanted to a region 410.

Then, the porous anodic oxide film 407 is removed by using mixed acid comprising acetic acid, nitric acid and phosphoric acid. Thus, the state shown in FIG. 4D is obtained.

Figure 4D:
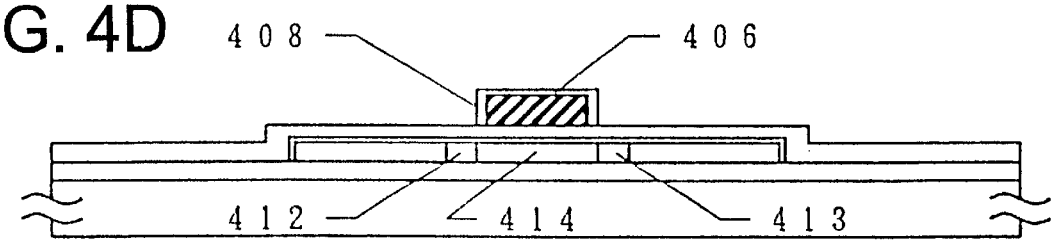

After obtaining the state shown in FIG. 4D, impurity ions are implanted again. The impurity ions are implanted under the doping condition lighter than that of the first implantion. In this step, lightly doped regions 412 and 413 are formed and a region 414 turns out to be a channel forming region (FIG. 4D).

Then, laser light or intense light is irradiated to activate the regions into which the impurity ions have been implanted. Thus, the source region 409, the channel forming region 414, the drain region 411 and low concentrate impurity regions 412 and 413 are formed in a manner of self-alignment. Here, the reference numeral 413 is designated the region called the LDD (lightly doped drain) (FIG. 4D).

Next, a silicon oxide film or a silicon nitride film or their laminated film is formed as an interlayer insulating film 415. The interlayer insulating film may be constructed by forming a layer made from a resin material on the silicon oxide film or the silicon nitride film.

Figure 4E:
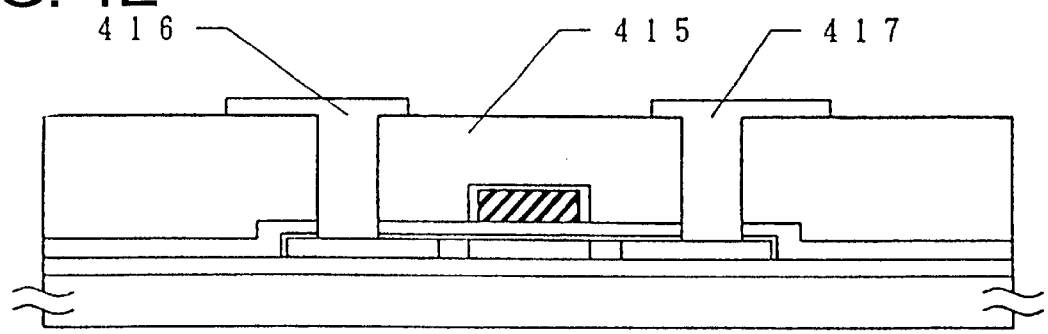

Next, contact holes, and then a source electrode 416 and a drain electrode 417 are formed. Thus, the thin film transistor shown in FIG. 4E is completed.

Sixth Embodiment

The present embodiment relates to a case when an N-channel type thin film transistor and a P-channel type thin film transistor are formed in a complementary manner. The arrangement shown in the present embodiment may be utilized for various thin film integrated circuits integrated on an insulated surface as well as for peripheral driving circuits of an active matrix type liquid crystal display for example.

Figure 5A:
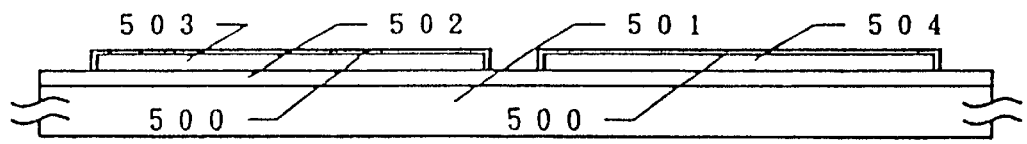
FIGS. 5A through 5E illustrate steps for fabricating a thin film transistor.

At first, a silicon oxide film or a silicon oxide nitride film is formed as an underlying film 502 on a glass substrate 501 as shown in FIG. 5A. It is preferable to use the silicon oxide nitride film.

Next, an amorphous silicon film not shown is formed by the plasma CVD or low pressure thermal CVD. Then, the amorphous silicon film is transformed into a crystalline silicon film by the same method as shown in the first embodiment.

Next, a plasma treatment is performed within an atmosphere in which oxygen and hydrogen are mixed. Then, the obtained crystalline silicon film is patterned to obtain active layers 503 and 504. Thus, the state shown in FIG. 5A is obtained.

It is noted that a heat treatment is performed at 650° C. for 10 hours within a nitrogen atmosphere containing 3% of HCl in the state shown in FIG. 5A in order to suppress the influence of carriers moving on the sides of the active layers. Because an OFF current characteristic becomes bad if a trap level exists due to the existence of metal element on the sides of the active layers, it is effective to perform the above-mentioned treatment to lower the level density on the sides of the active layers.

Further, a thermal oxide film 500 and a silicon oxide nitride film 505 which compose a gate insulating film are formed. When quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Besides the aluminum film, a metal which can be anodized (e.g. tantalum) may be used.

After forming the aluminum film, a very thin and dense anodic oxide film is formed on the surface thereof by the method described before.

Next, a resist mask not shown is placed on the aluminum film to pattern the aluminum film. Then, anodization is performed by setting the obtained aluminum pattern as the anode, then porous anodic oxide films 508 and 509 are formed. The thickness of the porous anodic oxide films is 5000 angstrom for example.

Figure 5B:
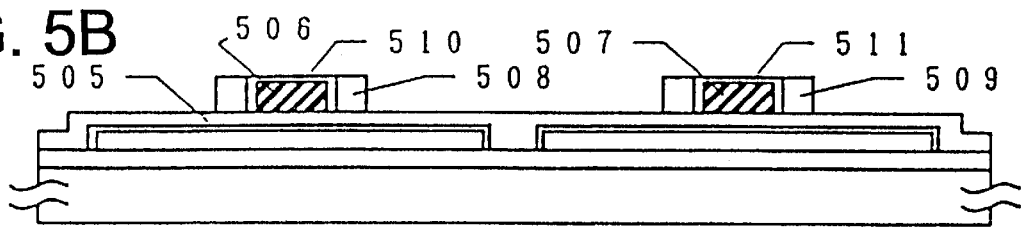

Then, another anodization is performed under the condition of forming dense anodic oxide films to form dense anodic films 510 and 511. The thickness of the dense anodic oxide films 510 and 511 is 800 angstrom. Thus, the state shown in FIG. 5B is obtained.

Figure 5C:
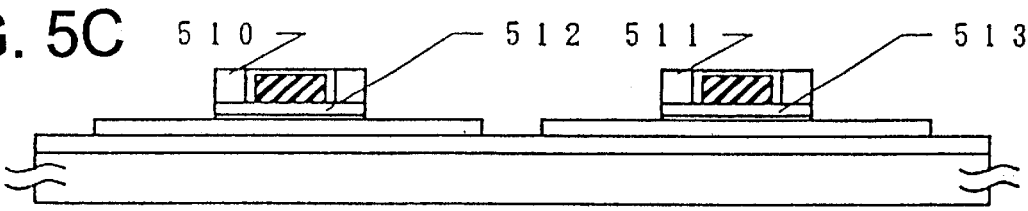

Then, the exposed silicon oxide film 505 and the thermal oxide film 500 are removed by dry etching, thus obtaining the state shown in FIG. 5C.

Figure 5D:
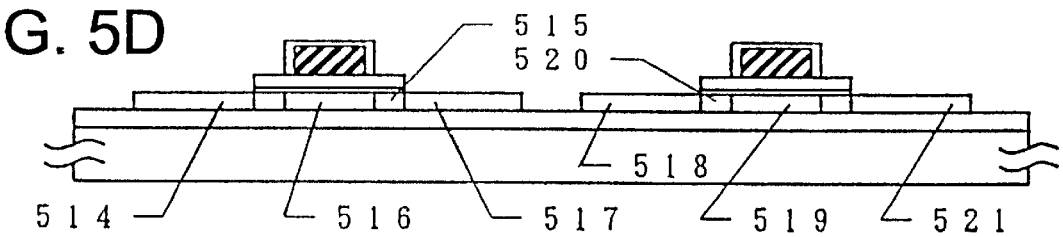

After obtaining the state shown in FIG. 5C, the porous anodic oxide films 508 and 509 are removed by using mixed acid in which acetic acid, nitric acid and phosphoric acid are mixed. Thus, the state shown in FIG. 5D is obtained.

Here, resist masks are disposed alternately to implant P ions to the thin film transistor on the left side and B ions to the thin film transistor on the right side. By implanting those impurity ions, a source region 514 and a drain region 517 having N-type in high concentration are formed in a manner of self-alignment.

Further, a region 515 to which P ions are doped in low concentration, thus having weak N-type, as well as a channel forming region 516 are formed in the same time. The reason why the region 515 having the weak N-type is formed is because the remaining gate insulating film 512 exists. That is, parts of P ions transmitting through the gate insulating film 512 is blocked by the gate insulating film 512.

By the same principle, a source region 521 and a drain region 518 having strong P-type are formed in a manner of self-alignment and a low concentrate impurity region 520 is formed in the same time. Further, a channel forming region 519 is formed in the same time.

It is noted that if the thickness of the dense anodic oxide films 510 and 511 is as thick as 2000 angstrom, an offset gate region may be formed in contact with the channel forming region due to that thickness of the films. In the case of the present embodiment, the existence of the offset region may be ignored because the dense anodic oxide films 510 and 511 are so thin as less than 1000 angstrom.

Then, laser light or intense light is irradiated to anneal the region into which the impurity ions have been implanted.

Figure 5E:
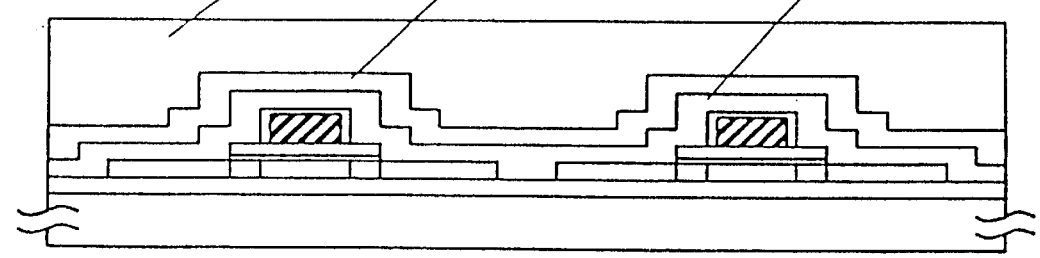
Figure 5F:
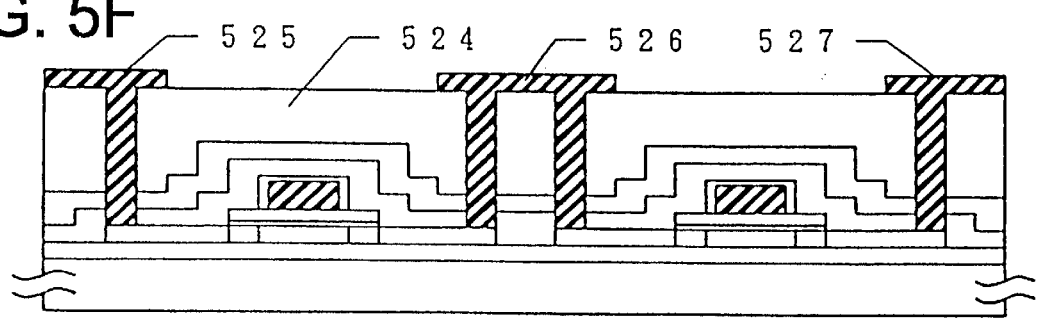

Then, a silicon nitride film 522 and a silicon oxide film 523 are formed as interlayer insulating films as shown in FIG. 5E. Their thickness is 1000 angstrom, respectively. It is noted that the silicon oxide film 523 needs not be formed always.

Here, the thin film transistor is covered by the silicon nitride film. The reliability of the thin film transistor may be enhanced by arranging as described above because the silicon nitride film is dense and has a favorite interfacial characteristic.

Further, an interlayer insulating film 524 made of a resin material is formed by means of spin coating. Here, the thickness of the interlayer insulating film 524 is 1 μm (FIG. 5E).

Then, contact holes are created to form a source electrode 525 and a drain electrode 526 of the N-channel type thin film transistor on the left side. In the same time, a source electrode 527 and the drain electrode 526 of the thin film transistor on the right side are formed. Here, the electrode 526 is disposed in common.

Thus, the thin film transistor circuit having a CMOS structure constructed in a complementary manner may be formed.

According to the arrangement shown in the present embodiment, the thin film transistor is covered by the nitride film as well as the resin material. This arrangement allows to enhance the durability of the thin film transistor to which movable ions nor moisture hardly infiltrate.

Further, it allows to prevent capacitance from being generated between the thin film transistor and wires when a multi-layered wire is formed.

Seventh Embodiment

The present embodiment relates to a case when elemental nickel is introduced directly to the surface of the underlying film in the process shown in the first embodiment. In this case, the elemental nickel is held in contact with the lower surface of the amorphous silicon film.

In this case, elemental nickel is introduced after forming the underlying film such that the elemental nickel (metal element) is held in contact with the surface of the underlying film. Besides the method of using the solution, sputtering, CVD or adsorption may be used as the method for introducing elemental nickel.

Eighth Embodiment

The present embodiment is characterized in that the crystallinity of an island pattern formed of a crystalline silicon film obtained by irradiating laser light in the state shown in FIG. 1E, the state shown in FIG. 2E or the state shown in FIG. 3A is improved.

A predetermined annealing effect can be obtained with relatively low irradiation energy density by irradiating the laser light in the state shown in FIGS. 2E, 3A and 4A. It is considered to have been effected because the laser energy is irradiated to a spot of small area, thus enhancing the efficiency of energy utilized in the annealing.

Effects of the Invention

The use of the invention disclosed in the present specification provides technology for reducing the concentration of metal element within the crystalline silicon film which has been obtained by utilizing the metal element to promote the crystallization of silicon.

The use of this technology also allows a more reliable and higher performance thin film semiconductor device to be obtained.

101: Glass Substrate or Quartz Substrate
102: Underlying Film (Silicon Oxide Film or Silicon Oxide Nitride Film)
103: Amorphous Silicon Film
104: Aqueous Film of Solution Containing Nickel
105: Crystalline Silicon Film
106: Pattern Made of Crystalline Silicon Film
107: Thermal Oxide Film
201: Glass Substrate or Quartz Substrate
202: Underlying Layer (Silicon Oxide Film or Silicon Oxide Nitride Film)
203: Amorphous Silicon Film
204: Mask Made of Silicon Oxide Film
205: Aperture
206: Nickel Held in Contact
207: Direction of Crystal Growth In parallel to Substrate
208: Silicon Film
209: Pattern Made of Region of Crystal Grown in Direction Parallel to Substrate
210: Thermal Oxide Film

What is claimed is:

1. A method for fabricating a semiconductor device, comprising steps of:
    forming a semiconductor film comprising amorphous silicon over a substrate having an insulating surface, said semiconductor film having a concentration of oxygen within a range of $5\times10^{17}$ cm$^{-3}$ to $2\times10^{19}$ cm$^{-3}$;
    intentionally introducing a metal element which promotes crystallization of silicon into said semiconductor film;
    obtaining a crystalline semiconductor film by crystallizing said semiconductor film by a first heat treatment in a temperature range of 750° C. to 1100° C.;
    forming an active layer of said semiconductor device by patterning said crystalline semiconductor film;
    removing or reducing said metal element existing within said crystalline semiconductor film by performing a second heat treatment within an oxidizing atmosphere containing a halogen element;
    removing a thermal oxide film formed in the previous step; and
    forming another thermal oxide film after removing said thermal oxide film by performing another thermal oxidation,
    wherein a temperature of said second heat treatment is higher than that of said first heat treatment.

2. A method for fabricating a semiconductor device, comprising steps of:
    forming a semiconductor film comprising amorphous silicon over a substrate having an insulating surface, said semiconductor film having a concentration of oxygen within a range of $5\times10^{17}$ cm$^{-3}$ to $2\times10^{19}$ cm$^{-3}$;
    intentionally introducing a metal element which promotes crystallization of silicon into said semiconductor film;
    obtaining a crystalline semiconductor film by crystallizing said semiconductor film by a first heat treatment in a temperature range of 750° C. to 1100° C.;
    forming an active layer of said semiconductor device by patterning said crystalline semiconductor film;
    performing a second heat treatment within an oxidizing atmosphere containing a halogen element in order to getter said metal element existing within said crystalline semiconductor film into a thermal oxide film to be formed;
    removing said thermal oxide film formed in the previous step; and
    forming another thermal oxide film after removing said thermal oxide film by performing another thermal oxidation,
    wherein a temperature of said second heat treatment is higher than that of said first heat treatment.

3. A method for fabricating a semiconductor device, comprising steps of:
    forming an amorphous semiconductor film comprising silicon over a substrate having an insulating surface, said amorphous semiconductor film having a concentration of oxygen within a range of $5\times10^{17}$ cm$^{-3}$ to $2\times10^{19}$ cm$^{-3}$;
    intentionally and selectively introducing a metal element which promotes crystallization of silicon into said amorphous semiconductor film;
    growing crystal in a direction parallel to said film from a region of said amorphous semiconductor film into which said metal element has been intentionally and selectively introduced by a first heat treatment in a temperature range of 750° C. to 1100° C.;
    forming an active layer of said semiconductor device by using a region in which the crystal has been grown in the direction parallel to said film by patterning;
    performing a second heat treatment within an oxidizing atmosphere containing a halogen element in order to getter said metal element existing within said active layer into a thermal oxide film to be formed;
    removing said thermal oxide film formed in the previous step; and
    forming another thermal oxide film after removing said thermal oxide film by performing another thermal oxidation,
    wherein a temperature of said second heat treatment is higher than that of said first heat treatment.

4. A method for fabricating a semiconductor device according to any one of claims 1 through 3, wherein a quartz substrate is used as said substrate on which said semiconductor film is formed.

5. A method for fabricating a semiconductor device according to any one of claims 1 through 3, wherein a gate insulating film is formed by utilizing said other thermal oxide film formed again.

6. A method for fabricating a semiconductor device according to any one of claims 1 through 3, wherein said metal element is selected from the group consisting of Fe, Co, Ni, Ru, Rh, Pd, Os, Ir, Pt, Cu and Au.

7. A method for fabricating a semiconductor device according to any one of claims 1 through 3, wherein annealing is carried out in a plasma atmosphere containing oxygen and hydrogen after removing said thermal oxide film.

8. A method for fabricating a semiconductor device, comprising the steps of:

forming a semiconductor film comprising amorphous silicon over a substrate having an insulating surface, said semiconductor film having a concentration of oxygen within a range of $5\times10^{17}$ cm$^{-3}$ to $2\times10^{19}$ cm$^{-3}$;

disposing a crystallization promoting material in contact with said semiconductor film wherein said crystallization promoting material is capable of promoting crystallization of said semiconductor film;

first heating the semiconductor film and the crystallization promoting material at a first temperature of 750° C. or hither in order to crystallize said semiconductor film; and second heating the crystallized semiconductor film in an oxidizing atmosphere at a temperature higher than said first temperature, thereby forming a thermal oxide film formed on the crystallized semiconductor film, wherein said oxidizing atmosphere contains chlorine.

9. A method for fabricating a semiconductor device, comprising the steps of:

forming a semiconductor film comprising amorphous silicon over a substrate having an insulating surface, said semiconductor film having a concentration of oxygen within a range of $5\times10^{17}$ cm$^{-3}$ to $2\times10^{19}$ cm$^{-3}$;

disposing a crystallization promoting material in contact with said semiconductor film;

first heating the semiconductor film and the crystallization promoting material at a first temperature of 750° C. or higher in order to crystallize said semiconductor film; and second heating the crystallized semiconductor film in an oxidizing atmosphere at a temperature higher than said first temperature, thereby forming a thermal oxide film on said semiconductor film; and removing said thermal oxide film, wherein said oxidizing atmosphere contains chlorine.

10. A method according to claim 8 or 9 further comprising a step of patterning the crystallized semiconductor film into an active layer before said second heating.

11. A method for fabricating a semiconductor device, comprising the steps of:

forming a semiconductor film comprising silicon over a substrate having an insulating surface, said semiconductor film having a concentration of oxygen within a range of $5\times10^{17}$ cm$^{-3}$ to $2\times10^{19}$ cm$^{-3}$;

disposing a crystallization promoting material in contact with said semiconductor film;

first heating the semiconductor film and the crystallization promoting material at a first temperature of 750° C. or higher;

patterning the crystallized semiconductor film into at least one active layer;

second heating the active layer in an oxidizing atmosphere at a temperature higher than said first temperature, whereby a thermal oxide film is formed on said active layer;

removing said thermal oxide film;

forming a gate insulating film on said active layer after removing said thermal oxide film; and forming a gate electrode over said active layer with said gate insulating film interposed therebetween.

12. A method according to claim 11 wherein said semiconductor film comprises amorphous silicon.

13. A method for fabricating a semiconductor device, comprising the steps of:

forming a semiconductor film comprising amorphous silicon over a substrate having an insulating surface, said semiconductor film having a concentration of oxygen within a range of $5\times10^{17}$ cm$^{-3}$ to $2\times10^{19}$ cm$^{-3}$;

disposing a crystallization promoting material in contact with said semiconductor film;

first heating the semiconductor film and the crystallization promoting material at a first temperature of 750° C. or higher in order to crystallize said semiconductor film;

patterning the crystallized semiconductor film into at least a semiconductor island;

second heating the semiconductor island in an oxidizing atmosphere at a temperature higher than said first temperature, thereby forming an insulating film on said semiconductor island, wherein said oxidizing atmosphere contains chlorine.

14. A method according to claim 13 wherein said insulating film is formed by thermal oxidation.

15. A method according to claim 8, 9, 11 or 13 wherein said crystallization promoting material comprises a metal selected from the group consisting of Fe, Co, Ni, Ru, Rh, Pd, Os, Ir, Pt, Cu and Au.

16. A method according to claim 8, 9, 11 or 13 wherein said semiconductor device is an EL display device.

17. A method according to claim 8, 9, 11 or 13 wherein said semiconductor device is a liquid crystal display device.

* * * * *